US012640213B2

(12) United States Patent
Lien et al.

(10) Patent No.: US 12,640,213 B2
(45) Date of Patent: May 26, 2026

(54) PROGRAM VERIFY COMPENSATION BY SENSING TIME MODULATION IN A MEMORY DEVICE WITH A DEFECTIVE DECK

(71) Applicant: MICRON TECHNOLOGY, INC., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 18/521,962

(22) Filed: Nov. 28, 2023

(65) Prior Publication Data

US 2024/0185934 A1      Jun. 6, 2024

Related U.S. Application Data

(60) Provisional application No. 63/429,708, filed on Dec. 2, 2022.

(51) Int. Cl.
| | |
|---|---|
| *G11C 16/34* | (2006.01) |
| *G11C 16/10* | (2006.01) |
| *G11C 16/26* | (2006.01) |
| *G11C 29/02* | (2006.01) |

(52) U.S. Cl.
CPC ........ *G11C 16/3459* (2013.01); *G11C 16/102* (2013.01); *G11C 16/26* (2013.01); *G11C 29/022* (2013.01)

(58) Field of Classification Search
CPC ... G11C 16/3459; G11C 16/102; G11C 16/26; G11C 29/022
USPC ...................................... 365/185.22
See application file for complete search history.

(56) References Cited

U.S. PATENT DOCUMENTS

| | | | |
|---|---|---|---|
| 10,325,665 B2 | 6/2019 | Fastow et al. | |
| 11,049,578 B1 | 6/2021 | Murai et al. | |
| 11,804,268 B2 | 10/2023 | Park et al. | |
| 2019/0043594 A1* | 2/2019 | Zhao ................... | G11C 11/5628 |
| 2019/0392893 A1* | 12/2019 | Yang ..................... | G11C 16/08 |
| 2021/0343351 A1* | 11/2021 | Chiang ............. | G11C 16/0483 |

\* cited by examiner

*Primary Examiner* — Anthan Tran
*Assistant Examiner* — Duy H Luong
(74) *Attorney, Agent, or Firm* — Lowenstein Sandler LLP

(57) ABSTRACT

A request to perform a program operation to program a set of memory cells on a memory device comprising a sense amplifier circuit is received. A defect indicator associated with the set of memory cells is determined to satisfy a defect condition. A modified sensing time period, exceeding a default sensing time period, is determined based on the defect indicator. The program operation is performed using the modified sensing time period during a program verify phase of the program operation.

20 Claims, 10 Drawing Sheets

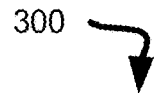
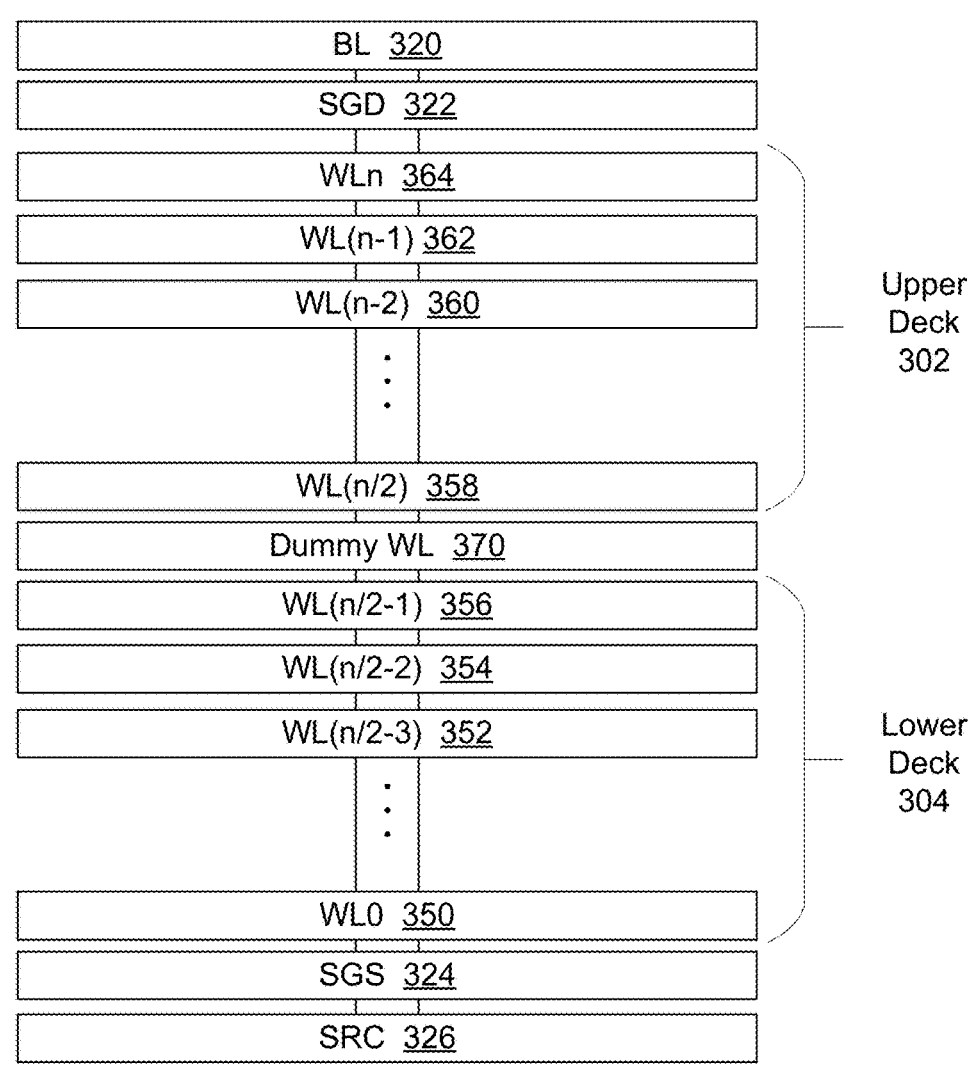
FIG. 3

| ADJUSTMENT TABLE 500 | | | | | | |
|---|---|---|---|---|---|---|
| Wordline 501 | Block ID 502 | Block Indicator 503 | Deck ID 504 | Deck Indicator 505 | Adjustment Indicator 506 | Sensing Time Period 510 |
| WL1 | B1 | PFB1 (PFB) | D1 | FD | N | Default |
| WL4 | B2 | PFB1 (PFB) | D2 | FD | Y | Elongated |
| ... | ... | PFB1 (PFB) | D3 | FD | Y | Elongated |
| ... | ... | FB | ... | FD | N | Default |
| ... | ... | PFB2 (PFB) | ... | FD | N | Default |
| WL6 | B2 | DB | D4 | DD | N | Default |
| ... | ... | ... | ... | ... | ... | ... |

500B

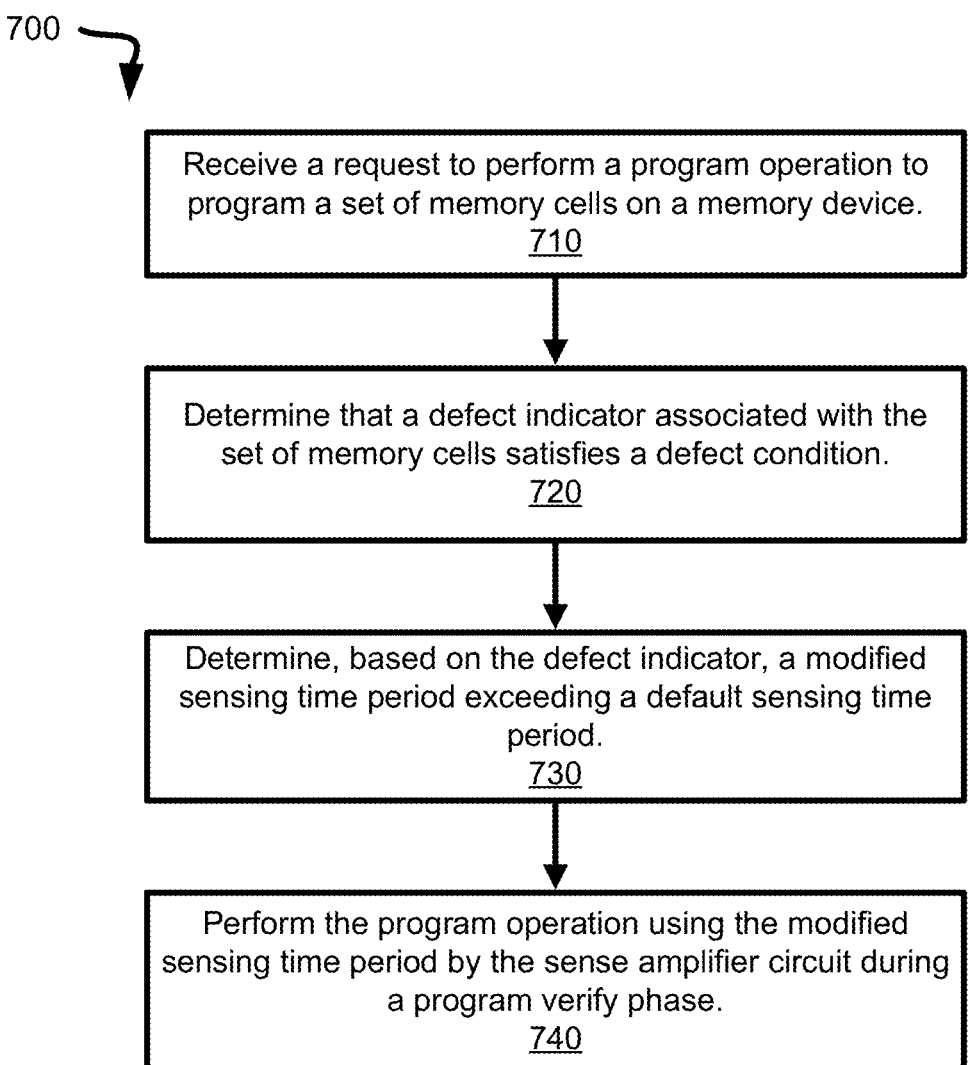

700

Receive a request to perform a program operation to program a set of memory cells on a memory device.
710

Determine that a defect indicator associated with the set of memory cells satisfies a defect condition.
720

Determine, based on the defect indicator, a modified sensing time period exceeding a default sensing time period.
730

Perform the program operation using the modified sensing time period by the sense amplifier circuit during a program verify phase.
740

FIG. 7

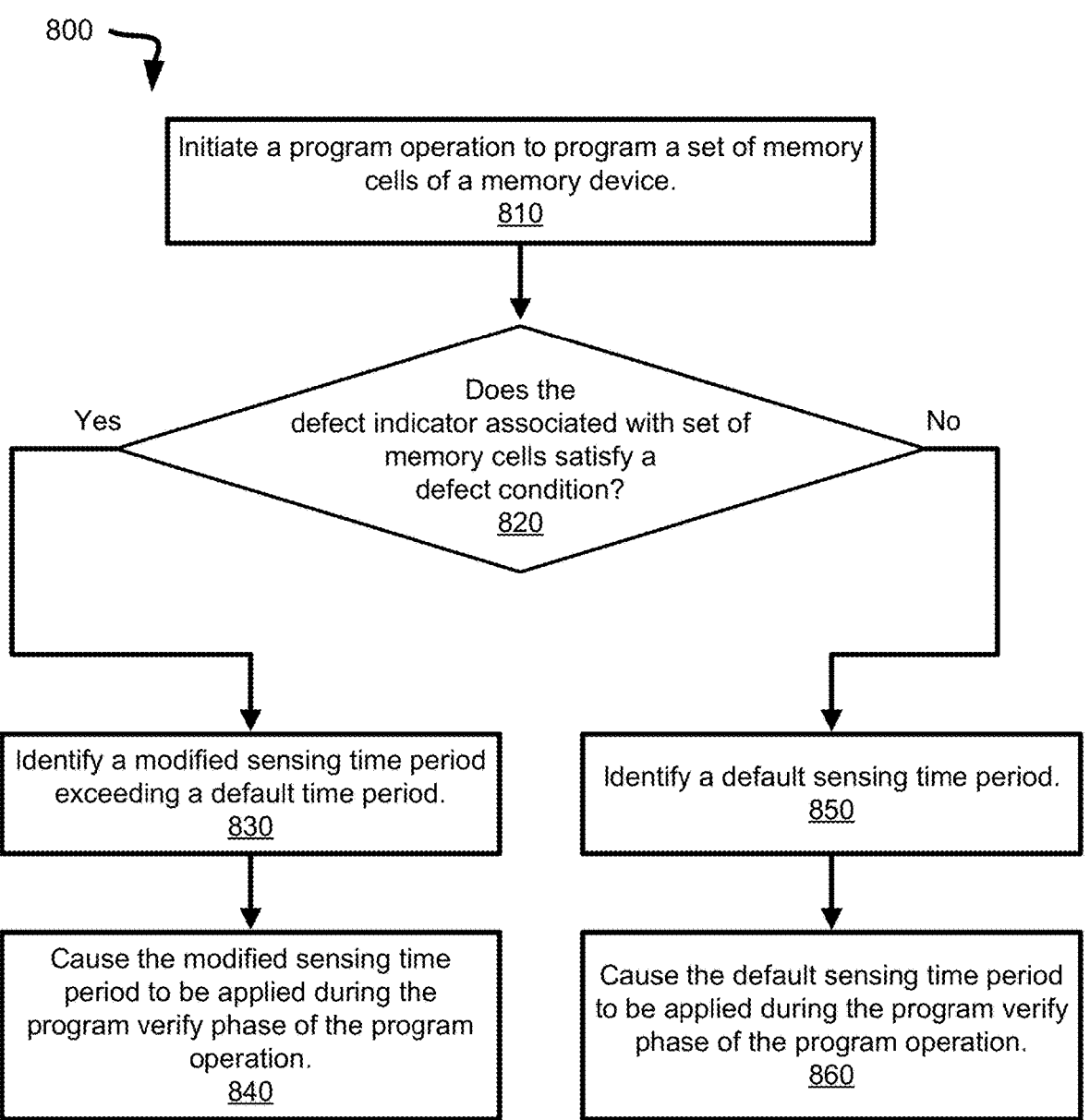

800

Initiate a program operation to program a set of memory cells of a memory device.
810

Does the defect indicator associated with set of memory cells satisfy a defect condition?
820

Yes

No

Identify a modified sensing time period exceeding a default time period.
830

Identify a default sensing time period.
850

Cause the modified sensing time period to be applied during the program verify phase of the program operation.
840

Cause the default sensing time period to be applied during the program verify phase of the program operation.
860

FIG. 8

PROGRAM VERIFY COMPENSATION BY SENSING TIME MODULATION IN A MEMORY DEVICE WITH A DEFECTIVE DECK

RELATED APPLICATIONS

This application claims the benefit of priority of U.S. Provisional Application No. 63/429,708, filed Dec. 2, 2022, the entire contents of which are hereby incorporated herein by reference.

TECHNICAL FIELD

Embodiments of the disclosure relate generally to memory sub-systems, and more specifically, relate to program verify compensation by sensing time modulation in a memory device with a defective deck.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates a physical block of a memory device that contains multiple decks, in accordance with some embodiments of the present disclosure.

FIG. 7 is a flow diagram of an example method to adjust the sensing time period applied during a program verify phase for a partially functional block condition, in accordance with some embodiments of the present disclosure.

FIG. 8 is a flow diagram of an example method to identify a sensing time period to apply during a program verify phase for a partially functional block condition, in accordance with some embodiments of the present disclosure.

DETAILED DESCRIPTION

Figure 1:
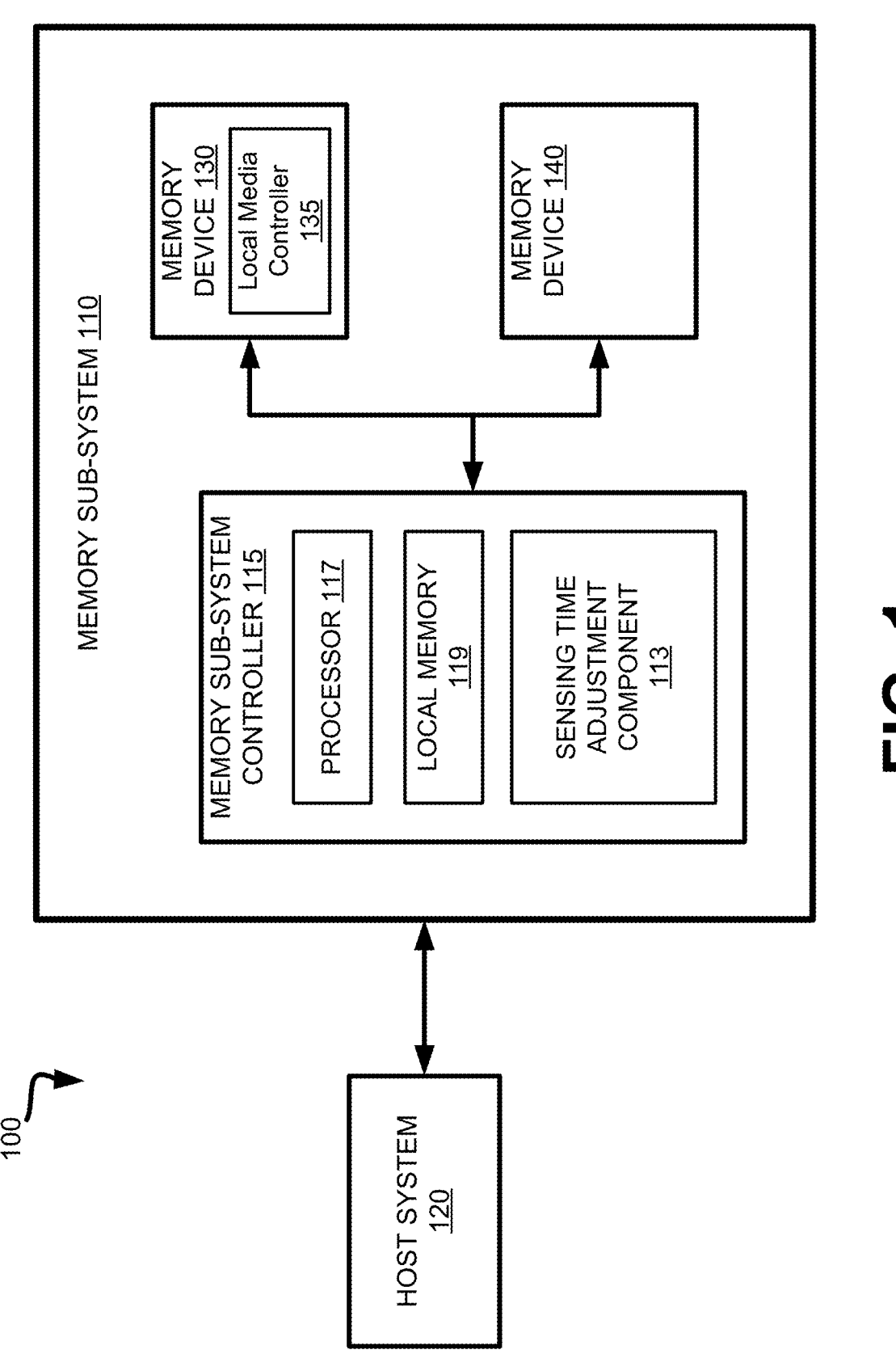
FIG. 1 illustrates an example computing system that includes a memory sub-system in accordance with some embodiments of the present disclosure.

Aspects of the present disclosure are directed to program verify compensation by sensing time modulation in a memory device with a defective deck. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can include of one or more planes. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A block hereinafter refers to a unit of the memory device used to store data and can include a group of memory cells, a wordline group, or a wordline. A memory array can be divided into multiple, equal-sized decks (e.g., each deck contains the same number of wordlines). A deck refers to a portion of a physical memory array that includes a subset of a memory cells of a block, such that a block can span over one or more decks, which can be separated by dummy wordlines. A deck consists of multiple horizontally stacked layers. The structure of some memory devices can be formed using a deck-by-deck process, during which some of the control gates and associated memory cells and switches are formed first in a first deck, and the other control gates and associated memory cells and switches can be formed second in a second deck. The first deck can be positioned physically below the second deck. A plane can be a vertical subdivision of the memory device. The controller can access multiple planes in parallel. That is, the controller can perform concurrent access operations on multiple planes. A plane can include one or more blocks. Thus, a deck can be defined as a two-dimensional (2D) array of memory cells electronically addressable by a vertical access line(s) (e.g., wordline(s)). Multiple decks can be stacked within a memory device (e.g., stacked vertically).

One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T,V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ can be fit into the working range allowing for storage and reliable detection of multiple values of the charge $Q_k$, k=1, 2, 3 . . . The distributions are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

During a read operation, a read reference voltage is applied to the wordline containing the data to be read, while a pass through voltage is applied to wordlines of unread memory cells. The pass through voltage is a read reference voltage higher than any of the stored threshold voltages. However, when data is read from a memory cell of the memory sub-system, nearby or adjacent wordlines can experience deterioration via, for example, read disturb, slow charge loss, etc. Read disturb is a phenomenon in NAND memory where reading data from a memory cell can cause the threshold voltage of unread memory cells in the same block to shift to a different value. Slow charge loss is a phenomenon where threshold voltage of a memory cell changes in time as the electric charge of the memory cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

Manufacturing parameters can also affect the rate of memory cell deterioration. In particular, each die of a memory device can have different electrical and physical characteristics due to process variation during manufacturing, such as temperature, supply voltage, etc. This "die-to-die variability" results in different error rates for different die subjected to the same operational conditions. For example, the worst page (e.g., page with the highest error rate on a die) on one die of the memory device can have twice the error rate of the worst page of another die of the memory device, where both dies were programmed at the same time.

Some memory devices can include multiple decks, and each deck can include multiple horizontally stacked layers. As the number of wordlines in a layer increases, the likelihood of a defect in one of the wordlines also increases. A defect may include wordline-to-wordline short, and/or open wordline. An open wordline indicates that a void occurred during cycling degradation, resulting in a disconnection of the electrical connection to the wordline. Thus, voltage signals cannot reach the open wordline. This defect can occur anywhere along the signal path. A wordline-to-wordline short is an electrical short that develops between two adjacent wordlines. When a certain voltage, such as a program voltage, is applied to one of those wordlines, a current is developed, at least a portion of which can flow through the electrical short and onto the adjacent wordline. This portion of the current can be referred to as a "leakage current." This leakage current can impact the logical values programed to or read from the memory cells connected to the associated wordlines leading to errors on the memory device. For example, a wordline-to-wordline short can cause a current (e.g., during a write operation applied to the selected wordline) to discharge some electrons to the wordline adjacent to the wordline being programmed. This results in the write operation failing to program data on the selected wordline, as well as the data on the adjacent wordline being corrupted.

In some cases, a defective wordline within a deck can make the deck unusable. For example, in a memory device that has two decks, a defective wordline in one of the decks may make the deck unusable ("defective"), while the other deck still can be used to store data and can be deemed as useable ("functional"). Such a "partially functional" memory device may be put in use by having the defective deck in an erase state. A "partially functional" memory device can be a memory device (or any unit of the memory device) having at least one functional deck and at least one defective deck. It can be advantageous to maintain the defective deck in an erase state. For example, if the defective deck is an upper deck in a two-deck memory device, the upper deck will be kept in the erase state and the bottom deck will be used to store data. In another example, only the functional deck can be erased and the defective deck can be left untouched. Such an erase scheme does not repeatedly erase the defective deck, and thus will avoid progressively adversely affecting the threshold voltage distributions of the functional deck. In yet another example, a preprogram operation may be performed by applying voltage pulses to all wordlines before applying the erase pulse to make the cells voltage more uniform after applying the erase pulse. However, for "partially functional" memory device, the erase scheme (including both the preprogram and the erase pulse operations) will not be performed on the defective deck.

Conversely, in a read operation, the pass through voltage used for a fully operational memory device (i.e., a memory device without any defective decks) can be applied to the entire "partially functional" memory device. This can result in more overdrive (i.e., the source-gate voltage necessary to turn on the device), higher string current (due to the increased overdrive), and a shift in the threshold voltage distribution, thus increasing the error rate (e.g., raw bit error rate (RBER)). Read operations can include a variety of read level adjustments to account for threshold voltage shift. For example, read level adjustments can be based on wordline group (WLG), temperature of the device, program erase cycle count, and block family error avoidance (BFEA). Adding an addition read level adjustment to counteract the effects of a defective deck within a memory devices may result in an overly burdensome and complicated read operation.

Aspects of the present disclosure address the above and other deficiencies by elongating the sensing time period applied by the sense amplifier circuit during the program verify phase of a program operation performed on a memory device (or a segment thereof) that contains both defective and functional decks. A program verify operation involves storing a target threshold voltage in a page buffer that is coupled to each data line (e.g., bitline) and applying a ramped voltage to the control gate of the memory cell being verified. When the ramped voltage reaches the threshold voltage to which the memory cell has been programmed, the memory cell turns on and sense circuitry detects a current on a bitline coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

A sense amplifier is used to read data contained in a memory cell during a read operation or during the program verify phase of a program operation. The sense amplifier determines the state of the cell by determining whether the cell is programmed (corresponding to a binary value of "0") or erased (corresponding to a binary value of "1"). The determination is based on a read voltage (i.e., the discharge of a sense capacitor node of the sense amplifier circuitry) compared to a reference voltage. Thus, a sense amplifier is part of the circuitry of a memory device, and is used to (1) sense power signals from a sense capacitor that represent data (e.g., "0" or "1") stored in a memory cell, and (2) amplify the sensed voltage to recognizable logic states. A logic state of "0" can represent programmed state of the memory cell, and a logic state of "1" can represent an erase state of the memory cell. The sense amplifier senses the voltage discharge of the sense capacitor at a given sensing time (e.g., after a sensing time period). Since the voltage discharge of a sense capacitor decays over time, the voltage sensed at time T will be higher than the voltage sensed at time T+1. Furthermore, during the program verify phase of a program operation, if the sense voltage at the end of the sensing time period is less than the reference voltage, the memory cell will receive additional programming pulses. Thus, a program verify phase operation that senses the voltage discharge at time T+1 results in a memory cell that is programmed to a higher voltage.

As the threshold voltage of a memory device shifts (e.g., due to the presence of a defective deck in the memory device), memory cells programmed to a target voltage may no longer accurately be read as being programmed (i.e., may be mistaken as being in an erase state). Thus, to counteract the voltage shift effects caused by programming to partially functional memory devices, embodiments described herein use a longer sensing time period during the program verify phase. The sensing time period specifies an amount of time after which the processing logic senses the voltage discharge of the set of memory cells. By elongating the sensing time period used during the program verify phase of a program operation, the memory cell being programmed will receive more program pulse to reach the target voltage, which is equivalent to more electrons being stored in the cell. Thus, the elongated sensing time results in a higher voltage being programmed to the memory cell. When the memory device experiences voltage shift due to programming to partially functional blocks, the higher voltage programmed to the memory cells will result will counteract the voltage shift.

Partially functional blocks satisfy the defect condition if the defective deck is positioned in such a way that a functional deck needs to be programmed before at least one defective deck (e.g., for memory devices that are programmed in a drain-to-source sequence, a partially functional block satisfies the defect condition if at least one functional deck is located closer to the drain than at least one defective deck). The memory sub-system controller can determine whether the block is "partially functional" based on whether the block contains a defective deck. In some embodiments, the memory sub-system controller can make this determination using a lookup table, each record of which maps a block address to a corresponding defect indicator. The defect indicator indicates whether the block contains a defective deck. In response to determining that the block is "partially functional" (i.e., contains a defective deck), the memory sub-system controller can determine whether at least one functional deck is to be programmed before at least one defective deck (referred to as a type-I partially functional block, or PFB1). That is, in a memory device in which program operations are executed in the drain-to-source sequence, the memory sub-system controller can determine whether at least one defective deck is physically disposed closer to the source than at least one functional deck.

In response to determining that the block is a PFB1 type block, the memory sub-system controller can perform a program operation on a set of memory cells associated with the block using an elongated sensing time period during the program verify phase. The elongated sensing time period results in the set of memory cells to be programmed to a higher voltage during the program operation. The elongated sensing time period can exceed a default sensing time period by a predetermined amount. In some embodiments, the memory sub-system controller can retrieve the elongated sensing time period parameter from a data structure stored on the memory device. The data structure stores sensing time period parameters associated with defective deck types. The sensing time period parameters can correspond to the cell type, the wordline type, the wordline group, the plane on which the set of cells resides, and/or on other parameters. In some embodiments, the elongated sensing time period parameter values can be predetermined at manufacturing of the memory device based on offline testing and media characterization of the memory device under various testing conditions. In some embodiments, the elongated sensing time period parameter values can be determined during operation of the memory device based on online testing and media characterization of the memory device under various testing conditions. In some embodiments, the elongated sensing time period parameter values can be tested with a specific wordline and used only with that wordline. In some embodiments, the elongated sensing time period parameter values can be tested with a representative wordline from a group of wordlines and used for any wordline from the group. The sensing time period parameter can be varied based on different cell types (e.g., SLC, MLC, TLC, or QLC), different cell levels (L1, L2, etc.), and/or different wordlines (WL1, WL2, etc.).

For example, a block can be a unit of the memory device. A block of the memory device can have at least two decks. A defective deck is a deck that does satisfies a criterion pertaining to a defect of a deck. For example, a metric of the deck (e.g., an average RBER, a number of defective wordlines in the deck) that exceeds a threshold value is considered to be an indication of a defective deck. Conversely, a functional deck is a deck that does not satisfy the criterion pertaining to a defect of a deck. For example, a metric of the deck (e.g., an average RBER, a number of defective wordlines in the deck) that does not exceed a threshold value is considered as an indication of a normally functioning deck. In some implementations, a defective deck can be identified by program operation failure, such as, the voltages applied in the program phase reaching the maximum voltage setting (e.g., pre-defined value), or program loops reaching the maximum loops setting (e.g., pre-defined values).

A block can be a functional block, a fully defective block, or a partially functional block (PFB). A functional block is a block that has only functional decks. A fully defective block is a block that has only defective decks. A partially functional block (PFB) is a block that has at least one functional deck and at least one defective deck. A partially functional block (PFB) can be a type-I PFB (PFB1) or a type-II PFB (PFB2). PFB1 refers to a PFB in which, during a program operation, at least one defective deck receives a voltage pass signal after at least one functional deck receives a program pulse. For example, if a program operation is processed from drain to source in a top-down fashion, a PFB1 refers to a PFB in which at least one defective deck is physically disposed closer to the source than at least one functional deck (i.e., if the drain is at the top, PFB1 refers to a PFB in which at least one defective deck is physically disposed below at least one functional deck). PFB2 refers to a PFB in which all functional decks are programmed last (i.e., any defective deck receives a VPASS signal prior to a functional deck receiving a program signal). For example, in the case in which a program operation is processed from drain to source in a top-down fashion, a PFB2 refers to a PFB in which no defective deck is physically disposed closer to the source than a functional deck (i.e., if the drain is at the top, PFB2 refers to a PFB in which no defective deck is physically disposed below a functional deck). In the example in which the program operation is processed in a drain to source sequence, and the drain is physically located at the top, for a two-deck block, PFB1 represents a functional deck physically disposed above a defective deck (F-D) block; PFB2 represents a defective deck physically disposed above a functional deck (D-F) block. For a three-deck block in which the program operation is processed in a drain to source sequence, and the drain is physically located at the top, PFB1 represents a D-F-D block, a F-D-D block, a F-D-F block, or a F-F-D block, where "F" stands for a functional deck, "D" stands for a defective deck, and "-" stands for its left-side item being physically disposed above its right-side item; and PFB2 represents a D-D-F block or a D-F-F block. Note that for cases in which a program operation is processed from source to drain, a PFB1 refers to a PFB in which at least one defective deck is physically disposed above at least one functional deck, and PFB2 refers to a PFB in which no defective deck is physically disposed above a functional deck.

Figure 6:
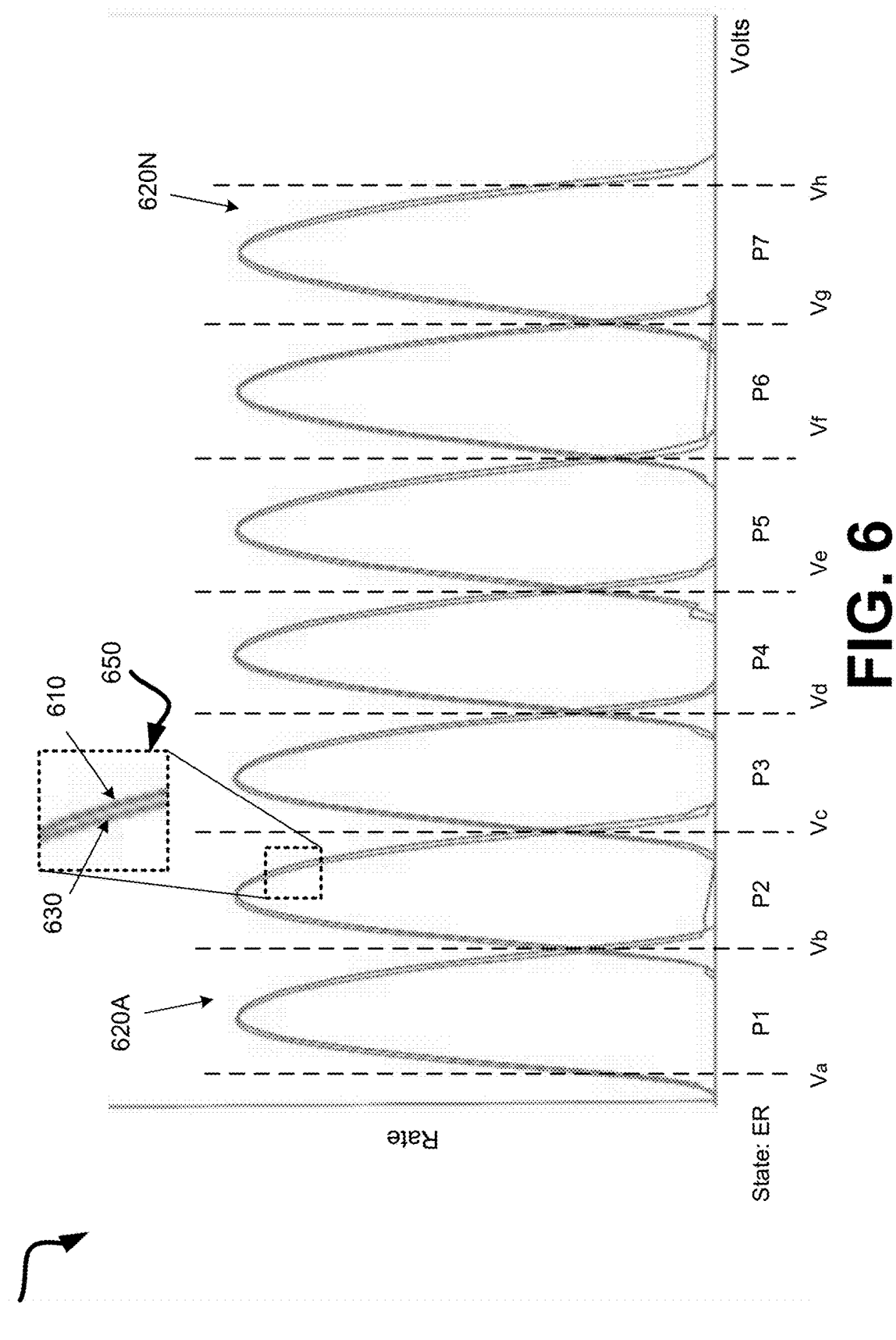
FIG. 6 schematically illustrates the threshold voltage distribution shift caused by the partially functional block compared with the functional block exhibited by triple-level memory cells, in accordance with some embodiments of the present disclosure.

In some embodiments, in order to determine whether the block is a PFB1 or PFB2, the memory sub-system controller can access a data structure that stores a PFB indicator associated with the address of the block to be programmed (e.g., the block address). The data structure can be maintained by the memory sub-system controller. In some embodiments, the data structure can reference metadata associated with each block, which includes whether the block is contains a defective deck, and identifies which of the decks in the block are defective. If the block is a PFB2, the memory sub-system controller can perform the program operation using a default sensing time period. If the block is a PFB1, the memory sub-system controller can identify an appropriate value for the sensing time period. In some embodiments, the memory sub-system controller can reference a lookup table corresponding to the PFB indicator to identify the value of the sensing time period based on the wordline group, the cell type (e.g., SLC, MLC. TLC), the block type, and the level to be programmed. For example, the lookup table can include the sensing time period parameter values (for each wordline group, cell type, block type, and/or level) to add to the default sensing time period value for PFB1 blocks. As another example, the lookup table can include the sensing time period parameter value (for each wordline group, cell type, block type, and/or level) to use instead of the default sensing time period value for PFB1 blocks. The sensing time period can be longer for program operations directed to PFB1 blocks than for program operations directed to PFB2 or fully functional blocks. That is, by elongating the sensing time period for PFB1 blocks, the memory sub-system controller increases the voltage programmed to the memory cells in a PFB1 block. Then, when the data is read from a PFB1 block using a default sensing time period, the higher programmed voltage will account for the resulting shift in voltage exhibited in PFB1 blocks. That is, because the memory cells of a PFB1 block are programmed to a higher level, as the voltage level shifts for the PFB1 block (as illustrated in FIG. 6), the voltage level of the programmed memory cells in a PFB1 block will align with the intended programmed values. By using an elongated sensing time period to program memory cells of a PFB1 block, a read operation directed to the PFB1 block will not require additional read offsets to account for the PFB1 voltage shift.

Advantages of the present disclosure include improved memory device performance and reliability. For example, implementing adaptively modulating sensing time periods can lower the error rate without contributing the complexity of read level optimization and without additional program time and/or read time latency. Thus, the reliability of the wordlines in a memory device that has both defective and functional decks can be improved, without any undue latency penalties.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a sensing time adjustment component 113 that can adjust the sensing time period used during the program verify phase of a programming operation. In some embodiments, the memory sub-system controller 115 includes at least a portion of the sensing time adjustment component 113. In some embodiments, the sensing time adjustment component 113 is part of the host system 120, an application, or an operating system. In other embodiments, local media controller 135 includes at least a portion of the sensing time adjustment component 113 and is configured to perform the functionality described herein.

The sensing time adjustment component 113 can determine the appropriate sensing time period parameter value(s) to use during the program verify phase of a program operation performed on a memory device (e.g., memory device 130, 140). The sensing time adjustment component 113 can receive a request to perform a program operation on a set of memory cells. In some embodiments, the request can be received from host 120. In some embodiments, the sensing time adjustment component 113 can be implemented by local media controller 135, and the request can be received from memory sub-system controller 115. The sensing time adjustment component 113 can determine whether the address of the set of memory cells to be programmed references a partially functional block on the memory device. The sensing time adjustment component 113 can use a table (such as adjustment table 500 in FIG. 5A), in which each block ID is associated a block indicator indicating whether the block is a partially functional block, and whether it is a type-I partially functional block (PFB1) or a type-II partially functional block (PFB2). In some embodiments, the table can store an indicator indicating whether to the sensing time period parameter is to be adjusted for program operations directed to specific block ID and/or wordline. The sensing time adjustment component 113 can identify the appropriate value for the sensing time period parameter. In some embodiments, the value of the sensing time period parameter can be included in the table referenced above (e.g., adjustment table 500 of FIG. 5A). In some embodiments, the sensing time adjustment component 113 can use a lookup table to identify the value of the sensing time period parameter to use to program the set of memory cells. Each record of the lookup table can store a value of the sensing time period parameter corresponding to the type of memory cells (SLC, MLC, TLC, QLC, PLC, etc.), the type of wordline (e.g., SLC wordline, TLC wordline), the wordline group, and/or the logical level to be programmed. For example, the sensing time parameter lookup table can include the entries as listed in Table 1, where A-K represent sensing time periods. In some embodiments, A-K can represent adjustments to a default sensing time period (i.e., the sensing time adjustment component 113 can add values A-K to a default sensing time period to obtain the value of the sensing time period to be applied during the program verify phase of the program operation). As indicated in Table 1, the sensing time period adjustment can be applied to all levels, including edge wordlines (e.g., wordlines adjacent to the select gates).

TABLE 1

| Sensing Time Period Parameter Values | | | |
| --- | --- | --- | --- |
| Block Type | Wordline Type | Level | Value |
| TLC | TLC | 1 | A |
| TLC | TLC | 2 | B |
| TLC | TLC | 3 | C |
| TLC | TLC | 4 | D |
| TLC | TLC | 5 | E |
| TLC | TLC | 6 | F |
| TLC | TLC | 7 | G |
| TLC | MLC | 1 | H |
| TLC | MLC | 2 | I |
| TLC | MLC | 3 | J |
| TLC | SLC | 1 | K |

In some embodiments, the sensing time period parameter values can be predetermined at manufacturing of the memory device based on offline testing and media characterization of the memory device under various testing conditions. In some embodiments, the sensing time period parameter values can be determined during the operation of the memory device based on online testing and media characterization of the memory device under various testing conditions. The sensing time adjustment component 113 can then perform the program operation using the identified value of the sensing time period parameter.

It will be appreciated by those skilled in the art that additional circuitry and signals can be provided, and that the components of FIG. 1 have been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Further details with regards to the operations of the sensing time adjustment component 113 are described below.

Figure 2:
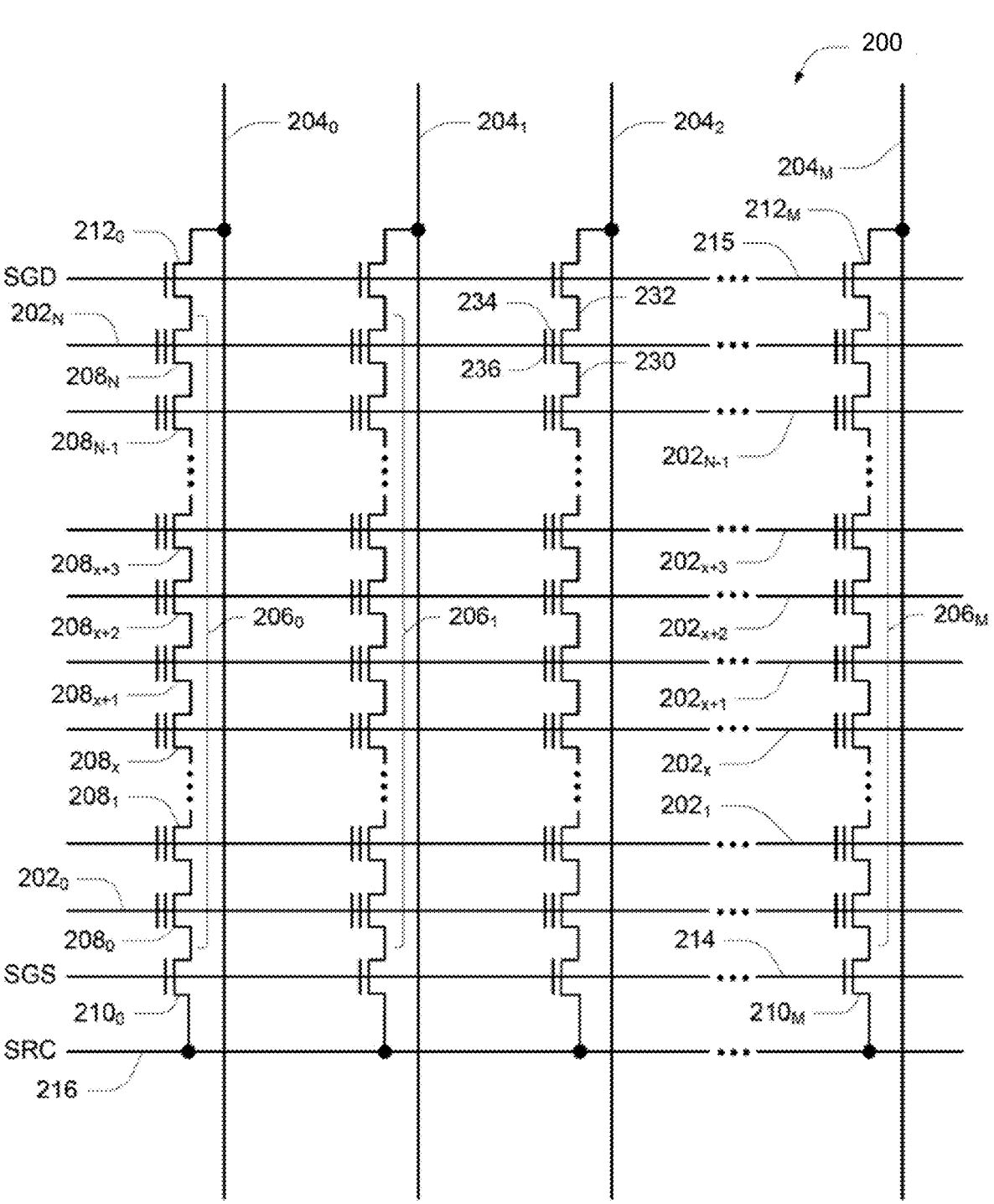
FIG. 2 is a schematic of portions of an array of memory cells as could be used in a memory device, in accordance with some embodiments of the present disclosure.

FIG. 2 is a schematic of portions of an array 200 of memory cells as could be used in a memory of the type described with reference to FIG. 1 according to an embodiment. Memory array 200 includes access lines, such as wordlines $202_0$ to $202_N$, and data lines, such as bitlines $204_0$ to $204_M$. The wordlines 202 can be connected to global access lines (e.g., global wordlines), not shown in FIG. 2, in a many-to-one relationship. For some embodiments, memory array 200 can be formed over a semiconductor that, for example, can be conductively doped to have a conductivity type, such as a p-type conductivity, e.g., to form a p-well, or an n-type conductivity, e.g., to form an n-well.

The memory array 200 can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216, or SRC. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200 in FIG. 2 can be a quasi-two-dimensional memory array and can have a generally planar structure, e.g., where the common source 216, NAND strings 206 and bitlines 204 extend in substantially parallel planes. Alternatively, the memory array 200 in FIG. 2 can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, or the like) that can determine a data state of the memory cell (e.g., through changes in threshold voltage), and a control gate 236, as shown in FIG. 2. The data-storage structure 234 can include both conductive and dielectric structures, while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2, it is apparent from the figure that the bitlines 204 of the array of memory cells 200 can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could be the entire row) that is read during a single read operation or programmed during a single program operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 3 illustrates an example physical block 300 of a memory device that contains multiple decks, in accordance with some embodiments of the present disclosure. As illustrated in FIG. 3, physical block 300 that includes two decks, namely upper deck 302 and lower deck 304. Note that a physical block can be divided into more than 2 decks. Between each deck 302, 304 is separated by a dummy wordline 370. Bitline 320 can be the same as or similar to bitline 204 of FIG. 2. Source select gate (SGS) 324 can be the same as or similar to the source select gate (SGS) as described with respect of FIG. 2. Similarly, drain select gate (SGD) 322 can be the same as or similar to the drain select gate (SGD) as describe with respect to FIG. 2. SRC 326 can be the same as or similar to SRC 206 of FIG. 2. Wordlines 350-364 can be the same as or similar to wordlines $202_0$ to $202_N$ of FIG. 2.

The upper deck 302 includes wordlines WL(n/2) 360 through WLn 364, where n represents the total number of wordlines, and n/2 represents the total number of wordlines divided by 2. The lower deck 304 includes wordlines WL0 350 through WL(n/2-1) 356. That is, each deck includes an equal number of wordlines. For example, if a physical block is divided into three decks, each deck would include n/3 wordlines, where n represents the total number of wordlines in the physical block. Thus, wordlines 350-364 can be evenly split between the decks 302, 304. When a threshold number of wordlines within a deck are defective, the entire deck can be rendered defective.

Figure 4:
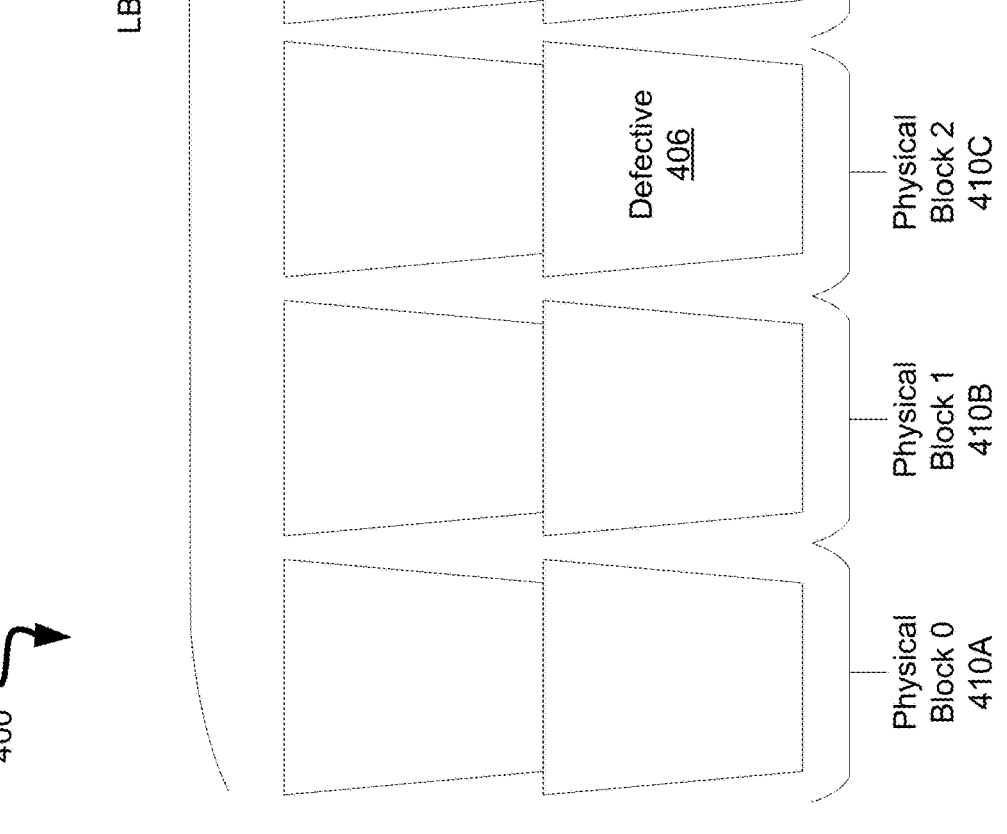
FIG. 4 illustrates a multi-plane logical block that includes defective and functional decks, in accordance with some embodiments of the present disclosure.

FIG. 4 illustrates a multi-plane logical block that includes defective and functional decks, in accordance with some embodiments of the present disclosure. Logical block 401 can reference multiple physical blocks 410A-F. In this example, logical block 401 references six physical blocks 410A-F. It should be noted that a logical block can reference fewer or more than size physical blocks. Each physical block 410A-F can correspond to a different plane. The memory device controller can perform concurrent operations to take place on each plane. In some embodiments, in order to perform concurrent multi-plane program operations, the sensing time adjustment component 113 can determine which planes (or which physical blocks 410A-F) are type PFB1, and can perform a program sub-operation using the sensing time period parameter associated with PFB1 blocks (410C, 410E). The sensing time adjustment component 113 can perform program sub-operations using a default sensing time period for the not PFB1 blocks (i.e., 410A, 410B, 410D, and 410F). In some embodiments, in order to perform concurrent multi-plane program operations, the sensing time adjustment component 113 can first perform the multi-plane program sub-operations on all blocks that are not PFB1 blocks (i.e., 410A, 410B, 410D, and 410F). The sensing time adjustment component 113 can then perform the program sub-operations on the PFB1 blocks (i.e., 410C, 410E) using an elongated sensing time period associated with PFB1 blocks. In some embodiments, after performing the program sub-operation on all blocks that are not PFB1 blocks (i.e., 410A, 410B, 410D, and 410F), the sensing time adjustment component 113 can raise the value of the sensing time period parameter. The sensing time adjustment component 113 can then perform the program sub-operations on the PFB1 blocks (i.e., 410C, 410E) using the raised sensing time period parameter value. Following the program sub-operations on the PFB1 blocks, the sensing time adjustment component 113 can then reset the value of the sensing time period parameter to the default value.

Figures 5A, 5B:
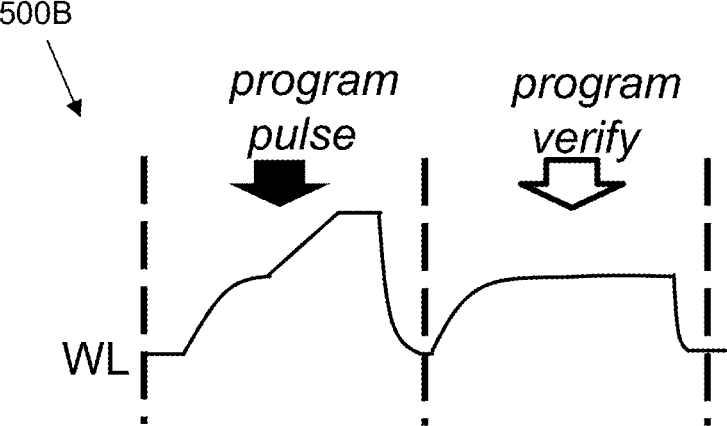
FIG. 5A is a an example adjustment table of a memory device, in accordance with some embodiments of the present disclosure.
FIG. 5B is a signal diagram illustrating example signals applied to a memory array during a program operation, in accordance with some embodiments of the present disclosure.

FIG. 5A illustrates an example adjustment table 500 of a memory device, in accordance with some embodiments of the present disclosure. As illustrated in FIG. 5A, an adjustment table 500 can be stored in a memory device (e.g., the memory device 130 of FIG. 1) and can be used in implementing adaptive adjustment of the sensing time period applied during the program verify phase of a program operation in a memory sub-system (e.g., the memory sub-system 110 of FIG. 1). The adjustment table 500 can include a record for each wordline 501 and a corresponding sensing time period applied during the program verify phase sensing time period 510. In some embodiments, wordline 501 can refer to a wordline group (not pictured). Each record can include a block ID 502, a block indicator 503, a deck ID 504, a deck indicator 505, an adjustment indicator 506, and/or a sensing time period 510.

A block ID 502 identifies a block in which the corresponding wordline 501 is disposed (e.g., the first entry in adjustment table 500 indicates that WL1 is disposed in B1). A block indicator 503 may indicate whether the block identified by the block ID 502 is a functional block (FB), a partially functional block (PFB), a type-I PFB (PFB1), a type-II PFB (PFB2), or a fully defective block (DB, i.e., one that includes only defective decks). A block can include multiple decks. For example, as illustrated in FIG. 3, a block can include two decks. A deck ID 504 identifies the deck in which the wordline 501 is disposed. A block indicator 505 may indicate whether the deck identified by deck ID 504 is a functional deck (FD) or a defective deck (DD). An adjustment indicator 506 may indicate whether to adjust sensing time period (e.g., Yes (Y) or No (N)), i.e., whether to use an elongated sensing time period or a default sensing time period during the program verify phase of a program operation directed to the block identified by block ID 502. The sensing time period applied during the program verify phase sensing time period 510 can be predetermined at manufacturing of the memory device based on offline testing and media characterization of the memory device under various testing conditions. Thus, a default sensing time period is used for WL1 of Block B1 since the block indicator 503 indicates a type PFB2, and an elongated sensing time period is used for WL4 of Block B2 since the block indicator 503 indicate a type PFB1.

FIG. 5B illustrates example signals 500B in a program operation in accordance with some embodiments of the present disclosure. During each program operation to a wordline, a program pulse is generated to program the wordline, followed by a separate program verify operation to verify the threshold voltages of the programmed cells of that wordline. The program operation may include a series of sub-operations, including, for example, hardware initialization, a seed operation in which cells of the wordline are preconditioned to a particular voltage, applying a pulse to program the wordline, performing a wordline/bitline recovery of the sub-block, performing a program verify operation to check whether the sub-block has been programmed to a particular threshold program verify voltage, perform a final verification operation to determine whether the programming has completed, and ending the program operation.

In order to perform the program verify operation, a voltage level is applied between the drain electrodes (SGD) and the source electrodes (e.g., SGS) of a memory cell that is connected to a conductive bitline shared by multiple memory cells. Elongating the sensing time period applied during the program verify phase results in a higher threshold voltage value being programmed at the particular memory cell being programmed. When the memory cells experience a threshold voltage shift, e.g., due to being disposed in a PFB1, the higher threshold voltage value will compensate for the threshold voltage shift. A read operation performed on the memory cells that were programmed in a PFB1 block using the higher program verify threshold voltage is less likely to receive an error.

In some embodiments, the memory cells are grouped into blocks, which can be further divided into sub-blocks, where a given wordline is shared across a number of sub-blocks. In one embodiment, each sub-block corresponds to a separate plane in the memory array 200. The group of memory cells associated with a wordline within a sub-block is referred to as a physical page. Each physical page in one of the sub-blocks can be one of multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). In some embodiments, a physical page formed from memory cells of the QLC memory type can have a total of four logical pages, where each logical page can store data distinct from the data stored in the other logical pages associated with that physical page. Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible.

In one embodiment, to perform the program verify operation, the local media controller 135 causes a bitline voltage to be applied to the selected wordline, for example, for each pass, during the program verify phase of the program operation. In some embodiments, local media controller 135 can use the sensing time period, according to sensing time 510 in table 500, to determine when the threshold programmed to a memory cell has reached the desired value (i.e., the sensing time period 510 level).

FIG. 6 schematically illustrates the threshold voltage distribution shift caused by the partially functional block compared with the functional block exhibited by triple-level memory cells, in accordance with some embodiments of the present disclosure. While the illustrative example of FIG. 6 utilizes triple-level cells, the same observations can be made and, accordingly, the same remedial measures are applicable to single level cells, multi-level cells, quad-level cells, and penta-level cells, in order to compensate for the threshold voltage distribution shift.

A memory cell can be programmed (written to) by applying a certain voltage (e.g., program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Chart 600 illustrates program distributions 620A-620N (also referred to as "voltage distributions" or "distributions" or "programming distribution") of memory cells programmed by a respective write level (which can be assumed to be at the midpoint of the program distribution) to encode a corresponding logical level ("000" through "111" in case of a TLC). The program distributions 620A through 620N can illustrate the range of threshold voltages (e.g., normal distribution of threshold voltages) for memory cells programmed at respective write levels (e.g., program voltages). As shown, a triple-level memory cell can have seven program distributions (e.g., distribution 1 (620A), distribution 2 (620B) . . . distribution 7 (620N)). In order to distinguish between adjacent distributions (corresponding to two different logical levels), the read threshold voltage levels (shown by dashed vertical lines) are defined, such that any measured voltage that falls below a read threshold level is associated with one distribution of the pair of adjacent program distributions, while any measured voltage that is greater than or equal to the read threshold level is associated with another distribution of the pair of neighboring distributions.

In chart 600, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 620A-620N, respectively.

The enlarged picture 650 shows part of example distributions 610 and 630, where distributions 610 reflects the distributions for a functional block, and distributions 630 reflects the distributions for a partially functional block. As seen from comparing example distributions 610 and 630, the voltage distributions shift. In order to reduce the read bit error rate, the corresponding sensing time period applied during the program verify phase are adjusted to compensate for the shift in program distributions, which would make the distributions 610 and 630 overlap. That is, after the corresponding sensing time period is applied, the distribution 630 shifts to overlap with the distribution 610.

In some embodiments, the voltage distribution shift is tracked for each wordline, and based on the measurements on each wordline, the sensing time applied during the program verify phase to the memory cells for the specific wordline are updated and applied during the program verify phase. In some embodiments, the voltage distribution shift is selectively tracked for die groups based on measurements performed at one or more representative dice of the die group. Based on the measurements made on representative dice of a die group that characterize the voltage distribution shift, the sensing time applied during the program verify phase to the memory cells for the dice of the die group are updated and are applied during the program verify phase.

FIG. 7 is a flow diagram of an example method 700 to adjust the sensing time period used during a program verify phase for a partially functional block condition, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the sensing time adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a request to perform a program operation to program a set of memory cells on a memory device, such as memory device 130 of FIG. 1. In some embodiments, the request for a program operation can be received at a memory sub-system controller (e.g., the memory sub-system controller 115 of FIG. 1) from a host device (e.g., the host system 120 of FIG. 1). In some embodiments, the request for a program operation can be received at the memory device (e.g., the local media controller 135 of FIG. 1) from the memory sub-system controller (e.g., memory sub-system controller 115 of FIG. 1). In some implementations, the set of memory cells is disposed in a block that comprises one or more decks. In the method 700, the block can be replaced by any unit of the memory device that includes one or more decks.

At operation 720, the processing logic determines that a defect indicator associated with the set of memory cells satisfies a defect condition. In some embodiments, the defect indicator can be associated with an address of the set of memory cells. In some embodiments, the defect indicator that satisfies the defect condition can indicate that the set of memory cells is disposed in a type-I partially functional block (e.g., block indicator 503 of FIG. 5A indicates PFB1). In some embodiments, the defect indicator can indicate that the sensing time period is to be adjusted for the set of memory cells (e.g., adjustment indicator 506 of FIG. 5A).

In some embodiments, the processing logic identifies a block corresponding to the address of the set of memory cells. The block can include more than one deck, e.g., a first deck and a second deck. The processing logic can determine that the first deck satisfies a defect criterion, and that the second deck does not satisfy the defect criterion. The defect criterion can indicate, for example, that at least a threshold number of wordlines within the deck are defective. For example, if more than one wordline within a deck is defective, the processing logic can determine that the deck satisfies the defect criterion (i.e., is defective). A defective wordline can be one that fails a functionality test. For example, a defective wordline can be one that is affected by a wordline-to-wordline short, or an open wordline. The processing logic can determine whether the first deck (i.e., the defective deck) is physically disposed below the second deck (i.e., the functional deck) (assuming the program operation is to be processed in the drain-to-source sequence, and the drain is physically positioned at the top). That is, the processing logic can determine whether the second (i.e., functional) deck is to receive a programming pulse operation before the first (i.e., defective) deck. If the first (i.e., defective) is physically disposed below the second (i.e., functional) deck the block is a type-I partially functional block (PFB1, e.g., as illustrated by block indicator 503 in FIG. 5A). If the second (i.e., functional) deck is physically disposed below the first (i.e., defective) deck, the block is a type-II partially functional block (PFB2, e.g., as illustrated by block indicator 503 in FIG. 5A). Note that there can be more than two decks in a block. If at least one functional deck is to be programmed before at least one defective deck, then the processing logic can determine that the defect indicator satisfies the defect criterion.

In some embodiments, to determine whether the first deck is physically disposed below at least one second deck, the processing logic determines that an identifier of a wordline group associated with the first deck is less than a threshold value. That is, as illustrated in FIG. 3, wordlines can be numbered from the bottom up (i.e., the wordlines identified with lower numbers can be physically disposed below the wordlines with the higher numbers). To determine that the first deck is physically disposed below at least one second deck, the processing logic can determine that a wordline number in the first deck (i.e., the defective deck) is lower than a threshold value. As an illustrative example, in the two-deck implementation illustrated in FIG. 3, the threshold value can be the midpoint of the total number of wordlines (i.e., WL(n/2-1)). In a three-deck implementation, the threshold value can be another value, such as one third of the total number of wordlines. The threshold value can also be another value as determined during manufacturing and characterization of the memory device.

At operation 730, the processing logic determines, based on the defect indicator, a modified sensing time period exceeding a default sensing time period. The sensing time period specifies an amount of time after which the processing logic senses the voltage discharge of the set of memory cells. The modified sensing time period can be determined based on the cell type, the block type, the wordline type, and/or the plane of the address of the set of memory cells. In some embodiments, the processing logic determines the modified sensing time period using a data structure (e.g., adjustment table 500 of FIG. 5A). The data structure can include multiple records, and each record can include a corresponding modified sensing time period (e.g., sensing time period 510 of FIG. 5A) that corresponds to the cell type, the block type, the wordline type, the plane, the wordline, and/or the block ID.

At operation 740, the processing logic performs the program operation using the value of the modified sensing time period by the sense amplifier circuit during a program verify phase of the program operation. In some embodiments, after performing the program operation, the processing logic can identify the default value of the sensing time period, and can reset the sensing time period parameter to the default value. The processing logic can then use the default value for future program operations.

In some embodiments, the processing logic can perform concurrent multi-plane program operations, and the address can include a number of physical blocks located in different planes of the memory device. For example, a multi-plane program operation can reference six physical blocks located in different planes (e.g., as illustrated in FIG. 4). In such a multi-plane program operation, not every block can include a defective deck (i.e., be a partially functional block). As an illustrative example, as shown in FIG. 4, three of the six can be partially functional blocks (illustrated as 406-408 in FIG. 4), and two of the six can be partially functional blocks that satisfy the defect condition (i.e., can be type-I PFB, or PFB1, illustrated as 406 and 408 in FIG. 4). In such case, to perform the program operation using the value of the sensing time period parameter during the program verify phase, the processing logic can identify a respective defect indicator for each of the planes corresponding to the address. The processing logic can identify the planes for which the respective defect indicator satisfies the defect condition (i.e., the defective planes, e.g., 406 and 408 of FIG. 4), and can perform a program sub-operation on the identified defective planes using the modified sensing time period identified in operation 930. The processing logic can then perform the program sub-operation on the rest of the planes (i.e., the planes for which the respective defect indicator does not satisfy the defect condition) using a default sensing time period. More specifically, the processing logic can identify a first plane of the plurality of planes referenced by the address of the set of memory cells. A first defect indicator associated with the first plane satisfies the defect condition, and thus the processing logic can perform a program sub-operation on the first plane using the modified sensing time period. The processing logic can identify a second plane of the plurality of planes referenced by the address. A second defect indicator associated with the second plane does not satisfy the defect condition, and thus the processing logic can perform the program sub-operation on the second plane using the default sensing time.

In some embodiments, the modified sensing time period can be determined through a characterization measurement on the set of cells. In some embodiments, the processing logic can perform a read operation on the set of cells using the default sensing time period. In some embodiments, the processing logic can perform a read operation on the set of cells using a default sensing time period that differs from the default sensing time period used to perform program verify operations for functional decks.

FIG. 8 is a flow diagram of an example method 800 to identify a sensing time period to apply during a program verify phase for a partially functional block condition, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the sensing time adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic initiates a program operation to program a set of memory cells of a memory device, such as memory device 130 of FIG. 1. In some embodiments, the request for a program operation can be received at a memory sub-system controller (e.g., the memory sub-system controller 115 of FIG. 1) from a host device (e.g., the host system 120 of FIG. 1). In some embodiments, the request for a program operation can be received at the memory device (e.g., the local media controller 135 of FIG. 1) from the memory sub-system controller (e.g., memory sub-system controller 115 of FIG. 1). In some implementations, the set of memory cells is disposed in a block that comprises one or more decks. In the method 800, the block can be replaced by any unit of the memory device that includes one or more decks.

At operation 820, the processing logic determines whether a defect indicator associated with the set of memory cells satisfies a defect condition. In some embodiments, the defect indictor can be associated with an address of the set of memory cells. If the defect indicator satisfies the defect condition, the method proceeds to operation 830. If the defect indicator does not satisfy the defect condition, the method proceeds to operation 850. In some embodiments, the defect indicator that satisfies the defect condition can indicate that the set of memory cells is disposed in a type-I partially functional block (e.g., block indicator 503 of FIG. 5A indicates PFB1). In some embodiments, the defect indicator can indicate that the sensing time period is to be adjusted for the set of memory cells (e.g., adjustment indicator 506 of FIG. 5A).

In some embodiments, the processing logic identifies a block corresponding to the address of the set of memory cells. The block can include more than one deck, e.g., a first deck and a second deck. The processing logic can determine that the first deck satisfies a defect criterion, and that the second deck does not satisfy the defect criterion. The defect criterion can indicate, for example, that at least a threshold number of wordlines within the deck are defective. For example, if more than one wordline within a deck is defective, the processing logic can determine that the deck satisfies the defect criterion (i.e., is defective). A defective wordline can be one that fails a functionality test. For example, a defective wordline can be one that is affected by a wordline-to-wordline short, or an open wordline. The processing logic can determine whether the second deck (i.e., the functional deck) is to receive a program pulse before the first deck (i.e., the defective deck). If the second (i.e., functional) deck is to receive a program pulse before the first (i.e., defective) deck, the block is a type-I partially functional block (PFB1, e.g., as illustrated by block indicator 503 in FIG. 5A). If the first (i.e., defective) deck is to receive a program pulse before the second (i.e., functional) deck, the block is a type-II partially functional block (PFB2, e.g., as illustrated by block indicator 503 in FIG. 5A). Note that there can be more than two decks in a block. If at least one functional deck is to be programmed before at least one defective deck, then the processing logic can determine that defect indicator satisfies the defect condition.

At operation 830, the processing logic identifies, based on the defect indicator, a modified sensing time period exceeding a default sensing time period. The sensing time period specifies an amount of time after which the processing logic senses the voltage discharge of the set of memory cells. The sensing time period can be determined based on the cell type, the block type, the wordline type, and/or the plane of the address of the set of memory cells. In some embodiments, the processing logic identified the modified sensing time period using a data structure (e.g., adjustment table 500 of FIG. 5A). The data structure can include multiple records, and each record can include a corresponding sensing time period (e.g., sensing time period 510 of FIG. 5A) that corresponds to the cell type, the block type, the wordline type, the plane, the wordline, and/or the block ID.

At operation 840, the processing logic causes the modified sensing time period to be applied during a program verify phase of the program operation. In some embodiments, after performing the program operation, the processing logic can identify the default sensing time period, and can reset the sensing time period to the default value. The processing logic can then use the default sensing time period for future program operations. In some embodiments, the processing logic can use the default sensing time period for read operations.

In some embodiments, the processing logic can perform concurrent (or parallel) multi-plane program operations, and the address can include a number of physical blocks located in different planes of the memory device. For example, a multi-plane program operation can reference six physical blocks located in different planes (e.g., as illustrated in FIG. 4). In such a multi-plane program operation, not every block can be a partially defective block (i.e., not every block can include a defective deck). As an illustrative example, as shown in FIG. 4, three of the six can be partially functional blocks (illustrated as 406-408 in FIG. 4), and two of the six can be partially function blocks that satisfy the defect condition (i.e., can be type-I PFB, or PFB1, illustrated as 406 and 408 in FIG. 4). In such case, to cause the modified sensing time period to be applied during the program verify phase, the processing logic can identify a respective defect indicator for each of the planes corresponding to the address. The processing logic can identify the planes for which the respective defect indicator satisfies the defect condition (i.e., the defective planes, e.g., 406 and 408 in FIG. 4), and can cause the modified sensing time period (i.e., identified at operation 830) to be applied during the perform verify phase of a program sub-operation for the identified planes. The processing logic can cause the default sensing time period to be applied during the program verify phase of the program sub-operation for the rest of the planes (i.e., the planes for which the respective defect indicator does not satisfy the defect condition). More specifically, the processing logic can identify a first plane of the plurality of planes referenced by the address of the set of memory cells. A first defect indicator associated with the first plane satisfies the defect condition, and thus the processing logic can cause the modified sensing time period to be applied during a program sub-operation for the first plane. The processing logic can identify a second plane of the plurality of planes. A second defect indicator associated with the second plane does not satisfy the defect condition, and thus the processing logic can cause the default sensing time period to be applied during the program sub-operation for the second plane.

At operation 850, responsive to determining that the defect indictor associated with the address of the set of memory cells does not satisfy the defect condition, the processing logic identifies a default sensing time period. At operation 860, the processing logic causes the default sensing time period to be applied during the program verify phase of the program operation.

Figure 9:
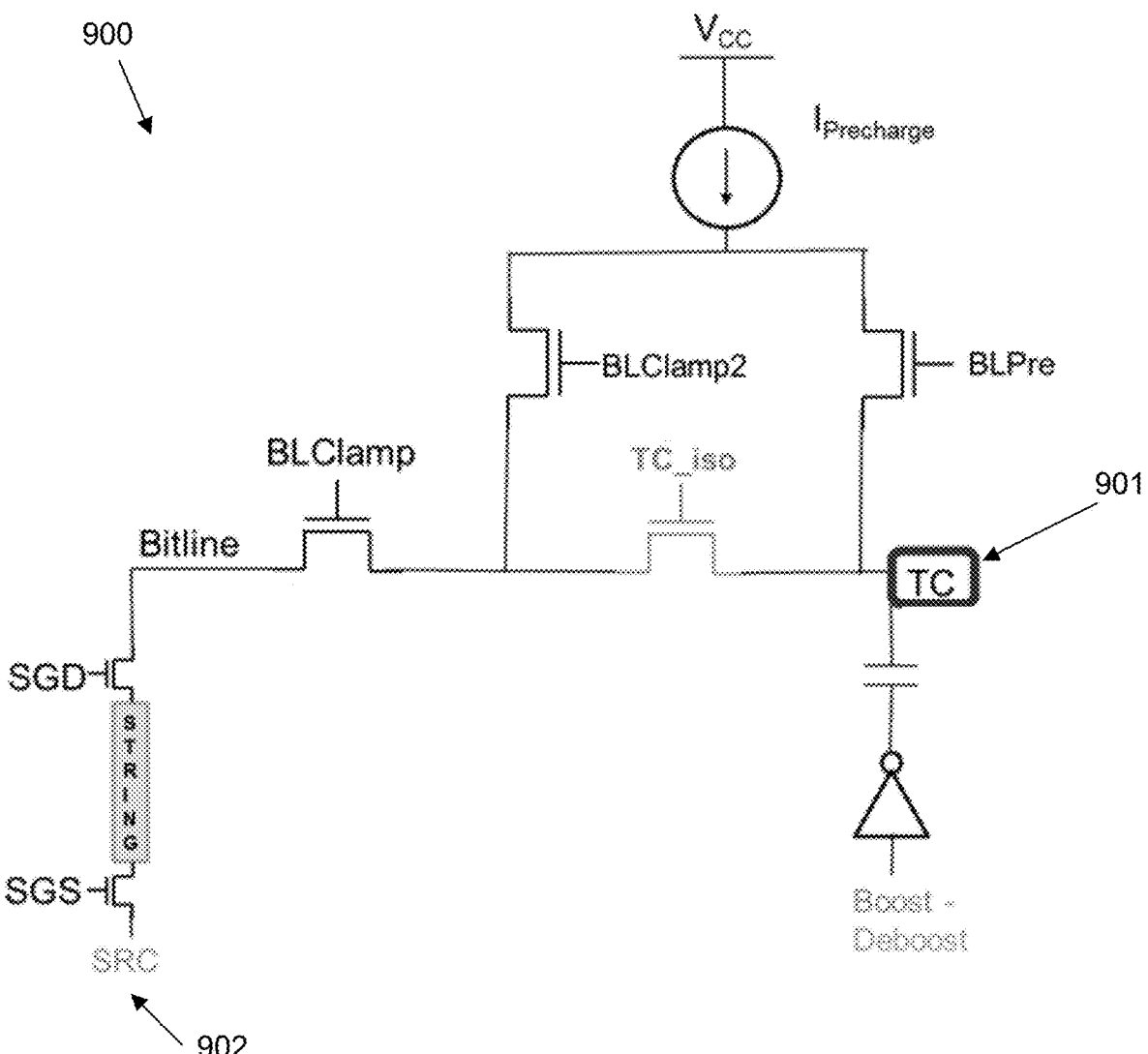
FIG. 9 is an example sense amplifier circuit, in accordance with some embodiments the of present disclosure.

FIG. 9 is an example sense amplifier circuit 900, in accordance with some embodiments of the present disclosure. The sense amplifier circuit 900 can be part of a memory device (e.g., memory device 130 of FIG. 1). The local media controller 135 and/or memory sub-system controller 115 can use the sense amplifier circuit 900 during the program verify phase of a program operation. In some embodiments, during the program phase of a program operation, a program pulse can be passed through SRC 902. The program pulse results in a program voltage being stored in the memory cell connected to the sense amplifier. During a program verify sub-operation, a voltage discharge is sensed from the sense capacitor (TC) 901 at the expiration of the particular sensing time period determined by the sensing time adjustment component 113.

Figure 10:
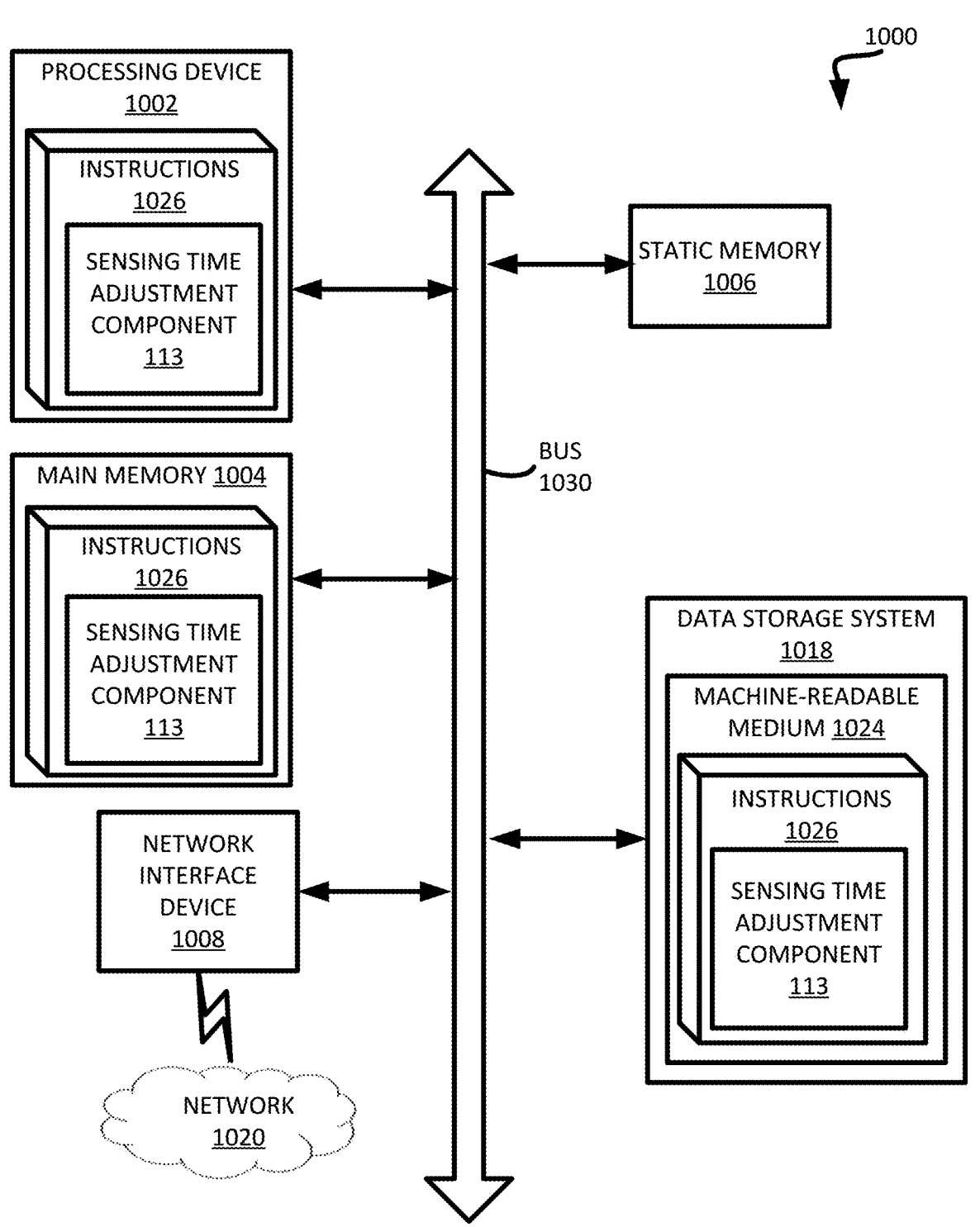
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sensing time adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or RDRAM, etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to a memory access monitoring component (e.g., the sensing time adjustment component 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device comprising a sense amplifier circuit; and a processing device, operatively coupled to the memory device, to perform operations comprising:

receiving a request to perform a program operation to program a page of the memory device;

maintaining a data structure comprising a plurality of records, wherein each record of the plurality of records comprises a block identifier of a corresponding block, a corresponding defect indicator indicating whether the corresponding block is a partially functional block having at least one defective deck, and a corresponding sensing time period;

responsive to determining that a defect indicator associated with a block comprising the page satisfies a defect condition, determining, using the data structure, a modified sensing time period for the page based on the corresponding sensing time period in the data structure, wherein the modified sensing time period exceeds a default sensing time period; and performing the program operation using the modified sensing time period by the sense amplifier circuit during a program verify phase.

2. The system of claim 1, wherein the operations further comprise:

performing a read operation on the page using the default sensing time period.

3. The system of claim 1, wherein performing the program operation using the modified sensing time period comprises:

identifying a first plane of a plurality of planes referenced by an address of the page, wherein a first defect indicator associated with the first plane satisfies the defect condition; and performing a program sub-operation on the first plane using the modified sensing time period.

4. The system of claim 1, wherein the operations further comprise:

determining that a first deck of a plurality of decks identified by an address of the page satisfies a defect criterion and a second deck of the plurality of decks does not satisfy the defect criterion; and responsive to determining that the first deck is physically disposed below the second deck, determining that the defect indicator satisfies the defect condition.

5. The system of claim 4, wherein determining that the first deck satisfies the defect criterion comprises:

determining that a threshold number of wordlines within the first deck are defective.

6. The system of claim 5, wherein determining that the first deck is physically disposed below the second deck comprises:

determining that an identifier of a wordline group associated with the first deck is less than a threshold value.

7. The system of claim 1, wherein the modified sensing time period is determined through a characterization measurement on the page.

8. The system of claim 1, wherein the corresponding sensing time period of each record of the plurality of records of the data structure corresponds to at least one of: a cell type, a level, a plane, or a numbered wordline.

9. A method comprising:

receiving a request to perform a program operation to program a page of a memory device comprising a sense amplifier circuit;

maintaining a data structure comprising a plurality of records, wherein each record of the plurality of records comprises a block identifier of a corresponding block, a corresponding defect indicator indicating whether the corresponding block is a partially functional block having at least one defective deck, and a corresponding sensing time period;

responsive to determining that a defect indicator associated with a block comprising the page satisfies a defect condition, determining, using the data structure, a modified sensing time period for the page based on the corresponding sensing time period in the data structure, wherein the modified sensing time period exceeds a default sensing time period; and performing the program operation using the modified sensing time period by the sense amplifier circuit during a program verify phase.

10. The method of claim 9, further comprising:

performing a read operation on the page using the default sensing time period.

11. The method of claim 9, wherein performing the program operation using the modified sensing time period comprises:

identifying a first plane of a plurality of planes referenced by an address of the page, wherein a first defect indicator associated with the first plane satisfies the defect condition; and performing a program sub-operation on the first plane using the modified sensing time period.

12. The method of claim 9, further comprising:

determining that a first deck of a plurality of decks identified by an address of the page satisfies a defect criterion and a second deck of the plurality of decks does not satisfy the defect criterion; and responsive to determining that the first deck is physically disposed below the second deck, determining that the defect indicator satisfies the defect condition.

13. The method of claim 12, wherein determining that the first deck satisfies the defect criterion comprises:

determining that a threshold number of wordlines within the first deck are defective.

14. The method of claim 12, wherein determining that the first deck is physically disposed below the second deck comprises:

determining that an identifier of a wordline group associated with the first deck is less than a threshold value.

15. The method of claim 9, wherein the modified sensing time period is determined through a characterization measurement on the page.

16. The method of claim 9, wherein the corresponding modified sensing time period of each record of the plurality of records of the data structure corresponds to at least one of: a cell type, a level, a plane, or a numbered wordline.

17. A non-transitory computer-readable storage medium comprising instructions that, when executed by a processing device, cause the processing device to perform operations comprising:

maintaining a data structure comprising a plurality of records, wherein each record of the plurality of records comprises a block identifier of a corresponding block, a corresponding defect indicator indicating whether the corresponding block is a partially functional block having at least one defective deck, and a corresponding sensing time period;

initiating a program operation to program a page of a memory device;

responsive to determining that a defect indicator associated with a block comprising the page satisfies a defect condition, identifying, using the data structure, a modified sensing time period based on the corresponding sensing time period in the data structure, wherein the modified sensing time period exceeds a default sensing time period; and causing the modified sensing time period to be applied during a program verify phase of the program operation.

18. The non-transitory computer-readable storage medium of claim 17, wherein the operations further comprise:

performing a read operation on the page of using the default sensing time period.

19. The non-transitory computer-readable storage medium of claim 17, wherein the operations further comprise:

determining that a first deck of a plurality of decks identified by an address of the page satisfies a defect criterion and a second deck of the plurality of decks does not satisfy the defect criterion; and responsive to determining that the first deck is physically disposed below the second deck, determining that the defect indicator satisfies the defect condition.

20. The non-transitory computer-readable storage medium of claim 17, wherein causing the modified sensing time period to be applied during the program verify phase of the program operation further comprises: identifying a first plane of a plurality of planes referenced by an address of the page, wherein a first defect indicator associated with the first plane satisfies the defect condition; and causing the modified sensing time period to be applied during a program sub-operation for the first plane.

* * * * *